United States Patent
Guisante et al.

(10) Patent No.: US 6,265,919 B1
(45) Date of Patent: Jul. 24, 2001

(54) IN PHASE ALIGNMENT FOR PLL'S

(75) Inventors: Roy Guisante, Murray Hill; David J. Hunley, Randolph; Eric D. Wallin, Boonton, all of NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/493,332

(22) Filed: Jan. 28, 2000

(51) Int. Cl.[7] ........................................... H03L 7/06
(52) U.S. Cl. .................. 327/159; 327/150; 327/162; 331/DIG. 2; 375/376
(58) Field of Search ........................ 327/146, 147, 327/150, 151, 155, 156, 159, 160, 162; 331/11, 12, 17, 25, DIG. 2, 1 A; 375/373–376; 365/233, 233.5

(56) References Cited

U.S. PATENT DOCUMENTS 4,456,884 * 6/1984 Yarborough, Jr. ..................... 341/72
4,972,442 * 11/1990 Steierman ............................ 375/357
5,415,046 * 5/1995 Guinon ................................. 73/660

* cited by examiner

Primary Examiner—Tuan T. Lam
Assistant Examiner—Minh Nguyen

(57) ABSTRACT

The present invention is directed to an improved PLL which produces an output signal that is in-phase with a reference clock input despite switching of the reference clock. A quadrature signal is generated using a quadrature decoder having a counter, a state decoder and a flip flop. A local oscillator having a local clock output having a frequency which is a multiple of the reference clock frequency is provided. The local clock output is divided down with a binary counter to match the reference signal frequency. The counter state is decoded using an AND in combination with a flip flop. The divided clock output is then re-synchronized with the reference clock using the local clock output coupled to the clock input of the flip flop. The output of the flip flop is an quadrature copy of the reference clock, and this quadrature signal is fed back to the phase detector. The resulting circuit overcomes the quadrature offset problem of typical XOR PLL circuits while retaining the noise and glitch immunity of such circuit arrangements.

15 Claims, 5 Drawing Sheets

IN PHASE ALIGNMENT FOR PLL'S

FIELD OF THE INVENTION

The present invention relates to the field of electronic circuits and, more particularly, to phase locked loop circuits with improved noise immunity and phase alignment.

DESCRIPTION OF THE RELATED ART

In general, a phase locked loop or PLL is an electronic circuit that controls a variable oscillator so that the oscillator maintains a constant phase angle relative to a reference signal. In operation, a PLL circuit will 'lock on' to an input and track its frequency and phase relationship. A PLL circuit can be used to synthesize or generate a frequency and maintain the phase of the generated signal to the reference. It can also be used to synchronize signals (or clocks) to a reference. PLL circuits are often incorporated in the clock systems of radio, television, satellite and telecommunication (e.g., mobile and cellular) systems. Basic PLL circuits typically include a lowpass filter (LPF), a voltage controlled oscillator (VCO), a phase detector and an integrating amplifier.

In typical cellular telephone or mobile communication applications, the output signal frequency (and the associated system clock) of the mobile device must be switched between a plurality of frequencies. However, switching the system clock can cause glitching in the associated PLL circuits and may disrupt the logic circuits that the system clock is driving. An effective way of reducing glitching in PLL circuits is to improve the phase detector by using exclusive-or (XOR) logic.

A typical XOR PLL is shown in FIG. 1. R1a, R1b, and C1 form a low-pass filter. RF is used to set the gain of the op-amp. Cfa forms an integrator and Cfb is used to improve high frequency stability. R2a, R2b and C2 are used to bias the op-amp at VCC/2. The optional divider can be used to synthesize frequencies other than the reference input frequency. The output of the VCO is coupled to the XOR phase detector which greatly improves glitch immunity when switching the reference clock.

However, XOR PLL circuits lock onto the quadrature of the reference clock. This is often undesirable in a digital circuit. In order to eliminate this quadrature phase offset, dividers can be coupled to both inputs of the XOR phase detector as shown in FIG. 2. The VCO output is divided by 4 to produce a ¼ frequency signal. Since the frequency being locked onto is ¼ of the reference and local frequencies, the phases of the reference and the local frequencies are automatically aligned. However, PLL circuits of this type suffer from glitch memory.

Another solution to the quadrature problem is the use of an edge sensitive phase detector. In the alternative, a digital phase detector using flip flops may be used. These types of PLL circuit are sensitive to glitching and the PLL circuit may be perturbed for many cycles after a glitch.

It would be desirable to provide a simple PLL circuit design with a low sensitivity to glitching while also providing a phase aligned output.

SUMMARY OF THE INVENTION

The present invention is directed to an improved PLL which produces an output signal that is in-phase with the reference clock input despite switching of the reference clock. A quadrature signal is generated using a quadrature decoder having a counter, a state decoder and a flip flop. A local oscillator having a local clock frequency which is a multiple of the reference clock frequency is provided. The local clock output is divided down with a binary counter to match the reference clock frequency. The counter state is decoded using an AND gate in combination with a flip flop. The divided clock output is then re-synchronized with the reference clock using the local clock coupled to the clock input of the flip flop. The output of the flip flop is a quadrature copy of the reference clock, and this quadrature signal is fed back to the phase detector. The resulting circuit overcomes the quadrature offset problem of typical XOR PLL circuits while retaining the noise and glitch immunity of such circuit arrangements.

BRIEF DESCRIPTION OF THE DRAWINGS

These and other features and advantages of the invention are more fully disclosed or rendered apparent from the following description of certain preferred embodiments of the invention, that are to be considered together with the accompanying drawings wherein like numbers refer to like parts and further wherein.

DETAILED DESCRIPTION

Figure 1:
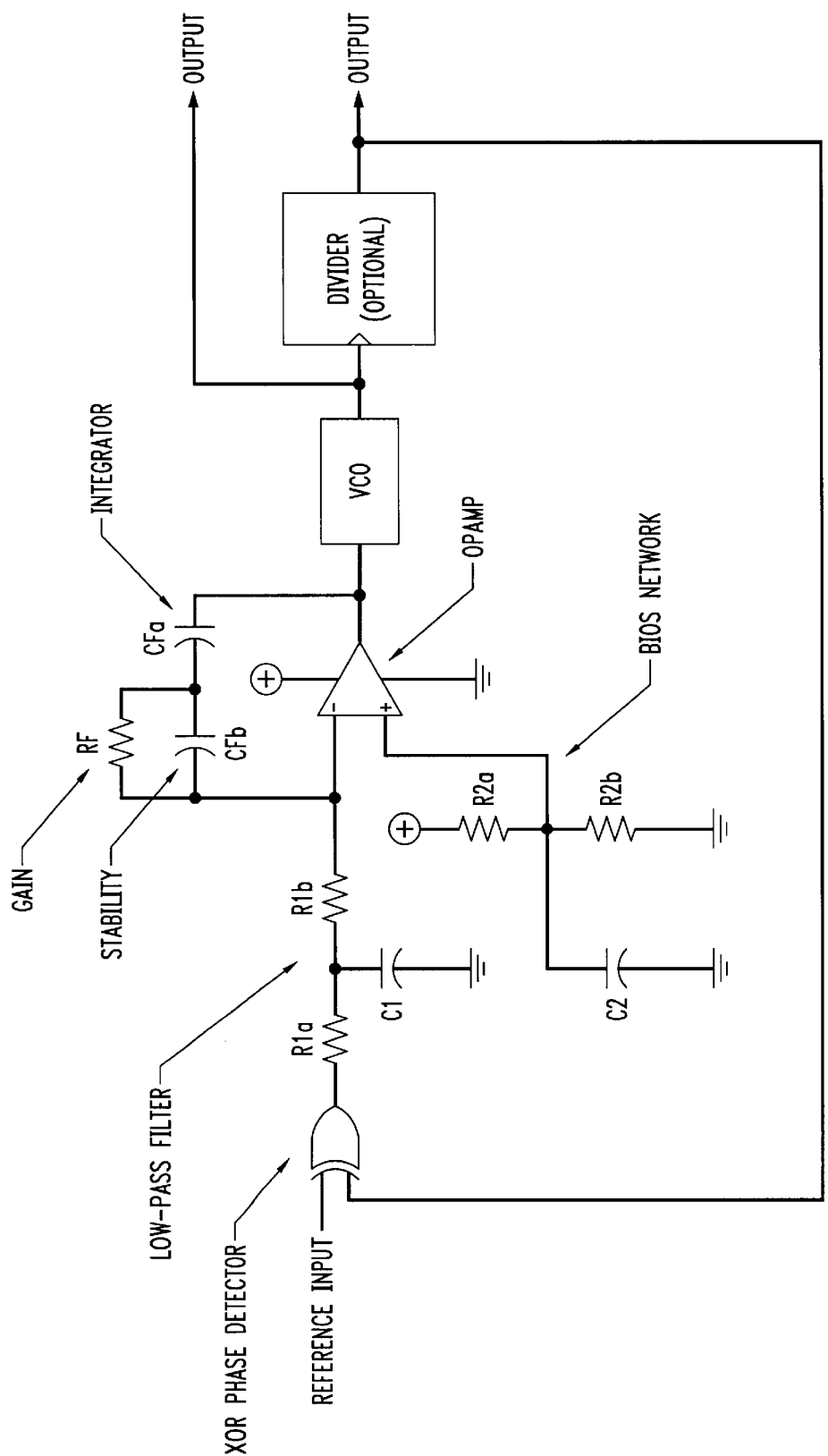
FIG. 1 is a schematic diagram of typical phase locked loop circuit with an XOR based phase detector.
Figure 2:
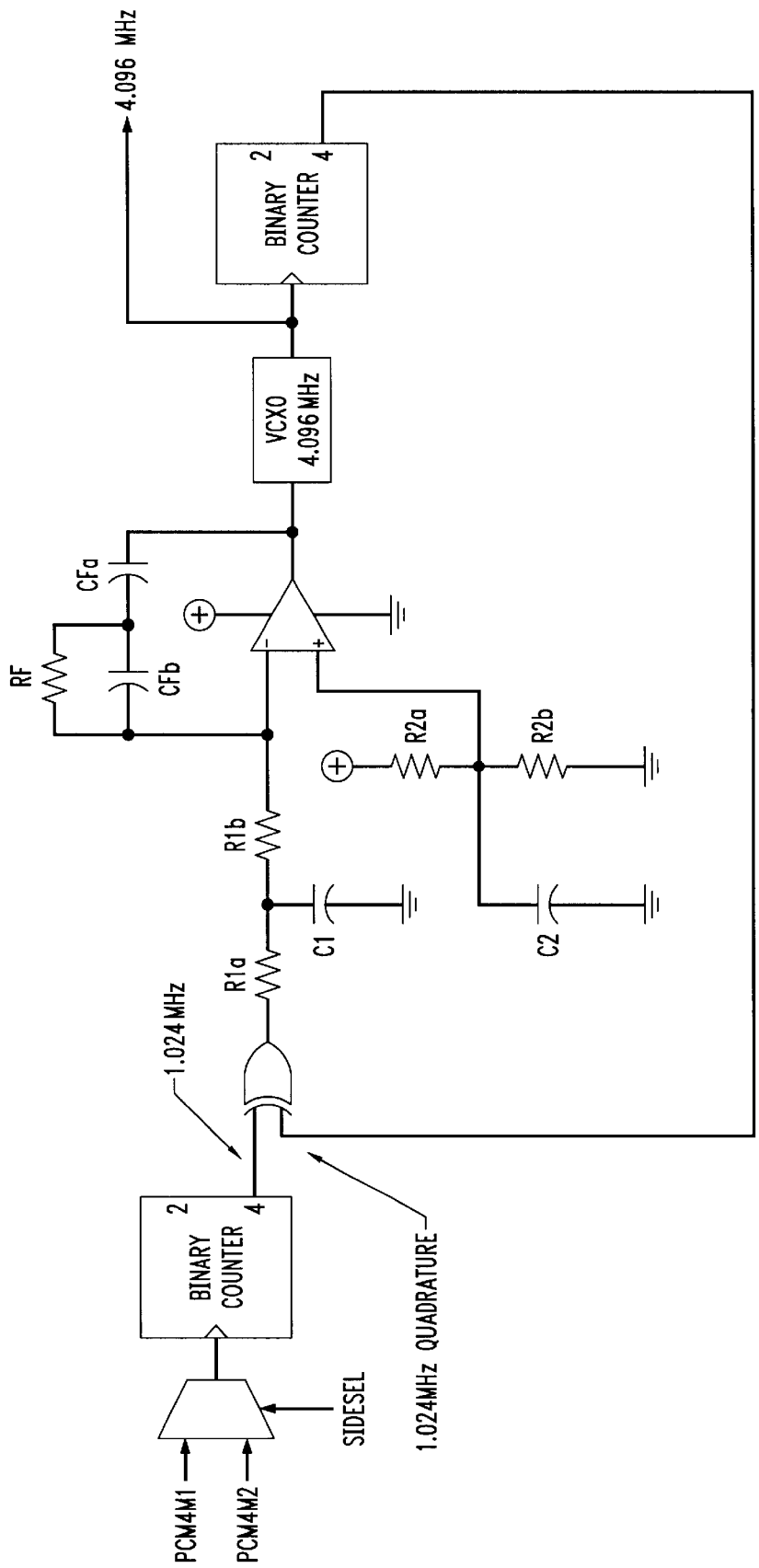
FIG. 2 is a schematic diagram of typical phase locked loop circuit with an XOR based phase detector using dividers to eliminate quadrature phase offset.
Figure 3:
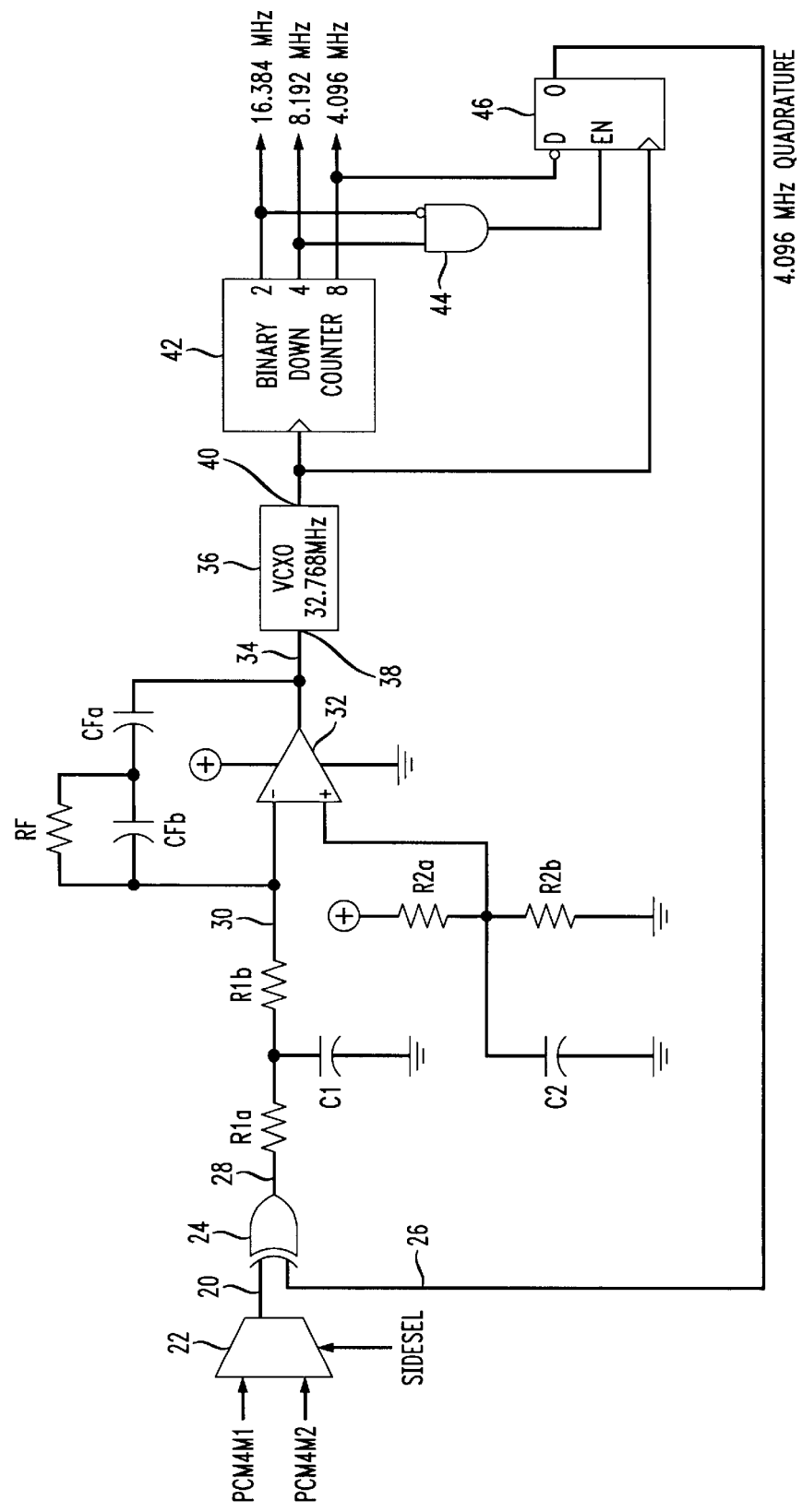
FIG. 3 is a schematic diagram of PLL circuit in accordance with the invention.

The present includes an improved PLL circuit design which produces an output signal that is in-phase with the reference input despite switching of the system clock. As shown in FIG. 3, the circuit is generally comprised of a lowpass filter (LPF), a controllable oscillator, in this case a voltage controlled clock oscillator (VCXO), a phase detector and an integrating amplifier. The low pass filter is formed of a traditional RC network. It is understood that the operational amplifier (op-amp), VCXO and various logic gates are coupled to appropriate power and ground connections (not shown). The controllable oscillator as used herein encompasses traditional voltage controlled oscillators as well as other controllable AC sources including but not limited to voltage controlled clock oscillators (VCXO).

A reference clock 20 is coupled to an input of the PLL circuit. In operation, the PLL circuit will 'lock on' to the reference clock input, and generate an in-phase output which tracks the reference clock frequency. Reference clock input 20 is provided by a data selector 22 having a pair of inputs coupled to two different reference clock sources and a having single output. The SIDSEL signal is used to select one of the two input clocks PCM4M1 and PCM4M2 for output by the data selector 22. It is understood that multiple clock sources can be provided via a plurality of means including but not limited to data selectors, multiplexers and the like.

The reference clock 20 is coupled to an input of the phase detector having an XOR gate 24. The phase detector compares a quadrature signal 26 (as discussed in detail below) with the reference clock signal 20 and produces a phase comparison signal 28. The output of the XOR gate is coupled to a low pass filter formed from R1a, R1b, and C1. The low pass filter removes the high frequency component of the phase comparison signal (i.e., smooths the phase comparison signal) and generates a smoothed phase comparison signal 30. The output of the low pass filter is coupled to the inverting input of the operational amplifier (op-amp) 32. Resistor RF is used to set the gain of the op-amp. Cfa forms an integrator and Cfb is used to improve high frequency stability of the op-amp. R2a, R2b and C2 are used to bias the op-amp at VCC/2. Op-amp 32 generates an amplified smoothed phase comparison signal 34. It is understood that the gain of op-amp 32 can be greater than, equal to or less than one. The component values for R1a, R1b, C1, RF, Cfa and Cfb are chosen to produce the desired jitter bandwidth and stability of the PLL.

VCXO 36 is generally operable to produce a periodic output 40 having a frequency correlated to the signal present at the control input 38 (i.e., a change in the control input voltage produces a change in the local clock output frequency). The output of the op-amp (smoothed phase comparison signal) 34 is coupled to the control input 38 of the VCXO 36, such that VCXO 36 produces a local clock output 40 having a frequency correlated to the amplified smoothed phase comparison signal 34. As shown in FIG. 3, VCXO 36 is set for an output of approximately 32.768 MHz. It is understood that the VCXO operating frequency is a multiple of the reference clock input and can be set by conventional means not shown. The local clock output 40 is coupled to a frequency divider including binary down counter 42. It is understood that an up counter or other types of state machines are also acceptable for use as a frequency divider in accordance with the invention. A divided output of the frequency divider is coupled to a quadrature decoder comprising AND gate 44 and flip flop 46 for generation of a synchronized 4.096 quadrature signal 26.

As shown in FIG. 3, the local clock output is coupled to binary down counter 42 having three output bits corresponding to the 2 ($2^1$), 4 ($2^2$) and 8 ($2^3$) bit positions. AND gate 44 is coupled to the 2 and 4 output of the down counter, the 2 output is inverted at the AND gate input. The output of the AND gate is coupled to the enable input of D-type flip flop 46. The 8 output of the down counter is coupled to the D input of flip flop 46. In operation, binary down counter 42, AND gate 44 and flip flop 46 decode a quadrature signal 26 that is synchronized to the reference clock 20.

Figure 4:
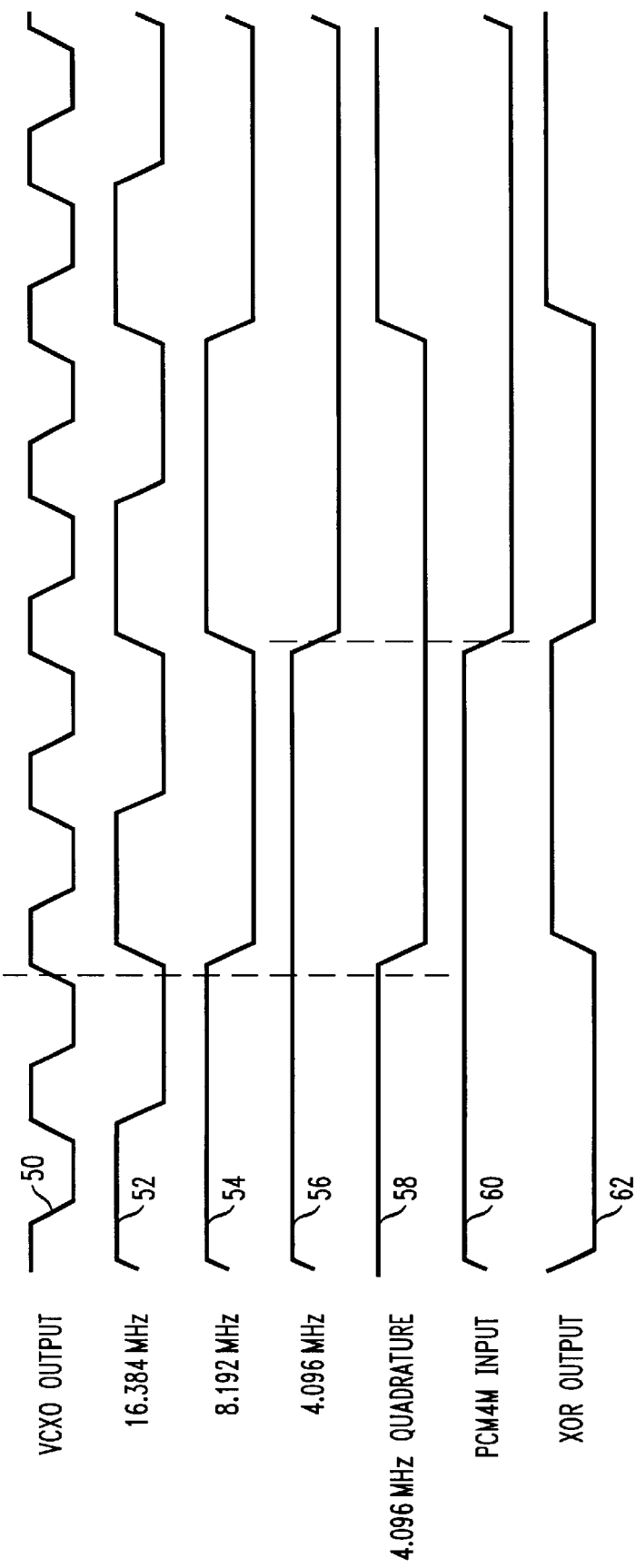
FIG. 4 shows a waveform diagram showing the operation of the circuit shown in FIG. 3.

FIG. 4 shows the significant waveforms of the PLL circuit in operation. The output of the controllable oscillator (VCXO 36) is shown at 50. The 2, 4 and 8 outputs of the frequency divider (down counter 42) are shown at 52, 54 and 56 respectively. The 8 output of down counter 42 has a frequency that is ⅛ of the VCXO output frequency (or local clock frequency), namely 4.096 MHz and is coupled to the D input of flip flop 46. The AND gate 44 decodes a specific counter state, namely when the 2 output of the down counter is low and the 4 output of the down counter is high. Thus, when the counter output is 010 or 110, the output of AND gate 44 is high and flip flop 46 is enabled. The VCXO output is used to clock flip flop 46 and thereby synchronizes the 4.096 signal with the VCXO output. The resulting 4.096 MHz quadrature signal, shown at 58 is fed back to the input of the phase detector. The phase detector compares the phase of the 4.096 MHz quadrature signal with the reference clock, shown at 60. The output of the phase detector (phase comparison signal) is shown at 62 and is coupled to the low pass filter formed from R1a, R1b, and C1. The low pass filter removes the high frequency component of the phase comparison signal (i.e., smooths the phase comparison signal) and generates a smoothed phase comparison signal.

The invention provides a controllable oscillator (VCXO 36) having a clock frequency which is a multiple of the reference clock. FIG. 3 shows one exemplary PLL system having a controllable oscillator having a clock rate that is approximately eight times the reference clock frequency. However, other controllable oscillator frequency multiples are possible without departing from the invention.

Figure 5:
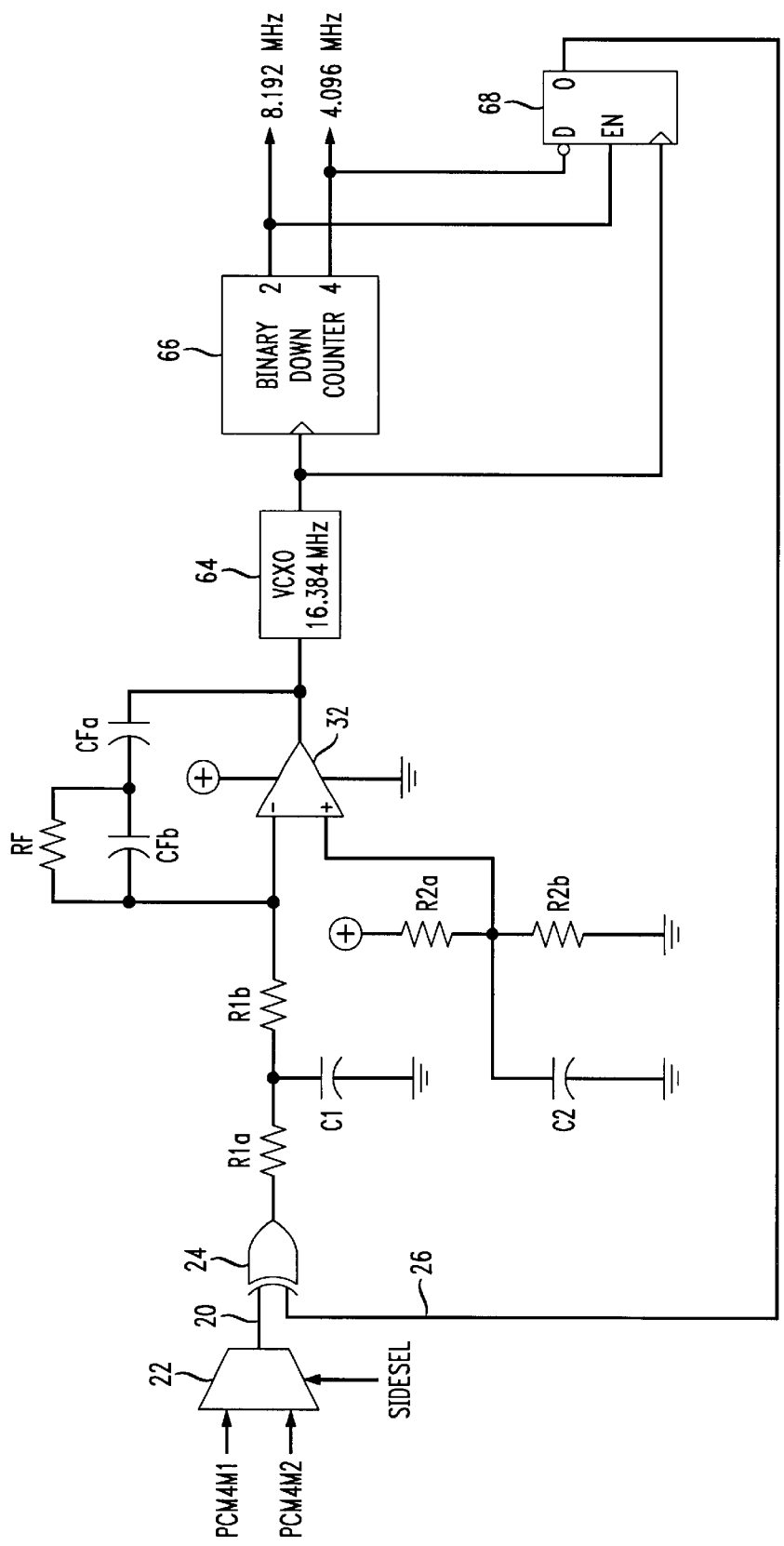
FIG. 5 shows a schematic diagram of alternate PLL circuit using a 16.384 Mhz VCXO in accordance with the invention.

For example, FIG. 5 shows an alternate embodiment of the invention. VCXO 64 provides a 16.384 MHz output. A divided output of VCXO 64 is coupled the flip flop 68 for decoding and generation of a synchronized 4.096 quadrature signal 26. The output of VCXO 64 is coupled to two bit binary down counter 66. The 4 output of down counter 66 is inverted and coupled to the D input of flip flop 68. The 2 output of down counter 66 is coupled to enable input of flip flop 68. The output of VCXO 64 is coupled to the clock input of flip flop 68. In operation, binary down counter 66, and flip flop 68 decode the 4.096 MHz quadrature signal 26 that is synchronized to the reference clock 20.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A phase locked loop circuit having at least one clock input coupled to a reference clock signal having a reference clock frequency, the circuit comprising:

a phase comparator having a quadrature signal coupled to a first input and said reference clock signal coupled to a second input, the phase comparator comparing the quadrature signal with the reference clock signal and producing a phase comparison signal;

a low pass filter having an input coupled to the phase comparison signal, said low pass filter smoothing the phase comparison signal thereby generating a smoothed phase comparison signal;

an amplifier having an input coupled to the smoothed phase comparison signal, the amplifier having a gain and generating an amplified smoothed comparison signal;

a controllable oscillator having a control input coupled to the amplified smoothed phase comparison signal, the controllable oscillator producing a local clock output having a frequency correlated to the amplified smoothed phase comparison signal, the local clock output having a frequency which is a multiple of the reference clock frequency;

a frequency divider having an input coupled to the local clock output, the frequency divider dividing the local clock output frequency and producing a divided local clock output having a frequency approximately equal to the reference clock frequency;

a quadrature decoder having a plurality of inputs, wherein one of said plurality of inputs is coupled to the divided local clock output and another of said plurality of inputs is coupled to the local clock output, the quadrature decoder generating said quadrature signal coupled to the first input of the phase comparator, the quadrature signal having a frequency approximately equal to the reference clock frequency, the quadrature signal differing in phase by 90° with respect to the reference clock signal.

2. The phase locked loop circuit of claim 1 wherein the phase comparator is an XOR gate.

3. The phase locked loop circuit of claim 1 wherein the amplifier is an integrating amplifier.

4. The phase locked loop circuit of claim 1 wherein the controllable oscillator is a VCXO.

5. The phase locked loop circuit of claim 1 wherein the frequency divider is a binary counter.

6. The phase locked loop circuit of claim 1 wherein the quadrature decoder comprises a D-type flip flop.

7. The phase locked loop circuit of claim 5 wherein the quadrature decoder comprises a D-type flip flop having a D input and an enable input each coupled an output of the binary counter, a clock input coupled to the local clock output and an output coupled to the first input of the phase comparator, said quadrature decoder generating said quadrature signal.

8. The phase locked loop circuit of claim 1 wherein the quadrature decoder comprises a D-type flip flop and an AND gate.

9. The phase locked loop circuit of claim 5 wherein the quadrature decoder comprises a D-type flip flop and an AND gate, the flip flop having a D input coupled to a first output of the binary counter and an enable input coupled to an output of the AND gate, the AND gate having at least two inputs each coupled to a second output and a third output, respectively, of the binary counter, the flip flop having a clock input coupled to said local clock and an output coupled to the first input of the phase comparator, said quadrature decoder generating said quadrature signal.

10. The phase locked loop circuit of claim 5 wherein the binary counter has at least two output bits and the controllable oscillator frequency is approximately four times greater than the reference clock frequency, and wherein the quadrature decoder comprises a D-type flip flop having a D input and an enable input each coupled an output of the binary counter, a clock input coupled to the local clock output and an output coupled to the first input of the phase comparator, said quadrature decoder generating said quadrature signal.

11. The phase locked loop circuit of claim 5 wherein the binary counter has at least three output bits and the controllable oscillator frequency is approximately eight times greater than the reference clock frequency, and wherein the quadrature decoder comprises a D-type flip flop and an AND gate, the flip flop having a D input coupled to a first output of the binary counter and an enable input coupled to an output of the AND gate, the AND gate having at least two inputs each coupled to a second output and a third output, respectively, of the binary counter, the flip flop having a clock input coupled to said local clock and an output coupled to the first input of the phase comparator, said quadrature decoder generating said quadrature signal.

12. The phase locked loop circuit of claim 10 wherein the binary counter has a $2^1$ output and a $2^2$ output, the flip flop D input being coupled to the $2^2$ output and the enable input being coupled to the $2^1$ output.

13. The phase locked loop circuit of claim 12 wherein the $2^2$ output is inverted and coupled to the flip flop D input.

14. The phase locked loop circuit of claim 11 wherein the binary counter has a $2^1$ output, a $2^2$ output and a $2^3$ output, wherein the D input is coupled the $2^3$ output, the AND gate has a first input coupled to the $2^1$ output and a second input coupled to the $2^2$ output.

15. The phase locked loop circuit of claim 14 wherein the $2^1$ output is inverted and coupled to the AND gate first input.

* * * * *